United States Patent [19]
Baugh et al.

[11] 3,978,329
[45] Aug. 31, 1976

[54] ONE-BIT FULL ADDER

[75] Inventors: Charles Richmond Baugh, Lincroft; Bruce Allen Wooley, Colts Neck, both of N.J.

[73] Assignee: Bell Telephone Laboratories, Incorporated, Murray Hill, N.J.

[22] Filed: Sept. 12, 1975

[21] Appl. No.: 612,760

[52] U.S. Cl. .............................................. 235/176
[51] Int. Cl.² ............................................ G06F 7/50
[58] Field of Search ................................... 235/176

[56]  References Cited
UNITED STATES PATENTS
3,519,810  7/1970  Priel et al. ......................... 235/176

OTHER PUBLICATIONS
MECL Integrated Circuits Data Book, Motorola, Inc., 1973, pp. 5–42 to 5–44.

*Primary Examiner*—R. Stephen Dildine, Jr.
*Attorney, Agent, or Firm*—William Ryan; Ronald D. Slusky

[57]  ABSTRACT

A high-speed, low-power 1-bit adder includes a combination of current-mode switches connected in a dual tree configuration in series with respective constant current sources and summing resistors. Input operand signals select particular tree paths, thereby controlling the voltage appearing across the summing resistors and sum and carry output drivers responsive to these voltages.

9 Claims, 3 Drawing Figures

ONE-BIT FULL ADDER

FIELD OF THE INVENTION

The present invention relates to digital logic circuits and, more particularly, to such circuits for performing digital arithmetic functions. Still more particularly, the present invention relates to current-mode logic circuits for performing serial binary addition.

BACKGROUND AND PRIOR ART

Many modern electronic systems function, at least in part, in accordance with digital arithmetic principles. While some systems, often those involving the greatest complexity, utilize so-called parallel arithmetic, an important class of data presented for digital arithmetic processing is serial in nature. Serial arithmetic is characterized by the operands being a time sequence of bits and the result being a similar bit stream. For example, serial addition consists of the two summand bit streams feeding a 1-bit adder, least significant bit first. The carry output of the 1-bit adder is fed back and used as an input to the adder, along with the next input bit, and the required sequence of sum bits is the resultant output bit stream. Further, it is well known that a serial-parallel pipeline multiplier can be constructed with a set of 1-bit adders. See, e.g., Freeny, "Special-Purpose Hardware for Digital Filtering", Proceedings of the IEEE, Vol. 63, No. 4, April 1975, pp. 633–648.

Serial arithmetic has found application in digital signal processing as, for example, in the serial addition of a pair of digitally encoded, serially transmitted voice channels to establish a conference call. Another typical application of serial arithmetic is in digital filtering, where both addition and multiplication are required. The digital signal processing environment is often a real-time system in which high speed and low power are desired. The high speed is desired to obtain a high multiplexing factor that will reduce the cost per operation, while the low power is desirable to reduce the operating costs and to increase the packaging density.

A great variety of circuits has been designed for implementing 1-bit binary full adders. A useful summary of optional designs using standard AND/OR and NOR/NAND gates is given in Liu et al, "Optimal One-Bit Full Adders With Different Types of Gates," IEEE Transactions on Computers, Vol. C-23, No. 1, January 1974, pp. 63–70.

Logic circuits using current-switching circuit techniques and, in particular, series gating circuit techniques have long been known in the electronic arts. Recent advances in large scale integrated transistor circuits have suggested the possible application of current-switching logic circuits for realizing, among other things, special purpose arithmetic circuits such as adders and multipliers.

For example, such an adder is marketed by Motorola Semiconductor Products, Inc., under the designations MC1019 and MC1219, as described more particularly in MECL Integrated Circuits Data Book, Motorola, Inc., 1973. Current-switching logic circuitry is attractive for a number of reasons, many of which are pointed out in the literature. It has a very low power-delay product, with the delay being primarily a function of a single RC time constant. Therefore, the power-delay product can be maintained over a range of speeds. The relatively slow RC rise times and the balanced nature of current-mode circuits result in low internal noise levels. Also, the wired OR, wired AND, and other standard techniques of current-mode logic permit the realization of specified logical functions with a minimum of circuitry.

SUMMARY OF THE INVENTION

The present invention, in typical embodiment, provides for the realization of a high-speed, low-power 1-bit adder using a combination of current-mode logic elements. In particular, this embodiment provides two series-gating trees, each connected to a respective constant current source. Each path through the trees corresponds to a particular combination of operand inputs, and sum and carry outputs are driven by the voltage drop across summing resistors arranged to reflect the particular pattern of such inputs.

Since a typical application of serial 1-bit adders is in implementing a multiplication, circuit connections are provided to readily adapt the basic adder for this important auxiliary function.

DETAILED DESCRIPTION

Figure 1:
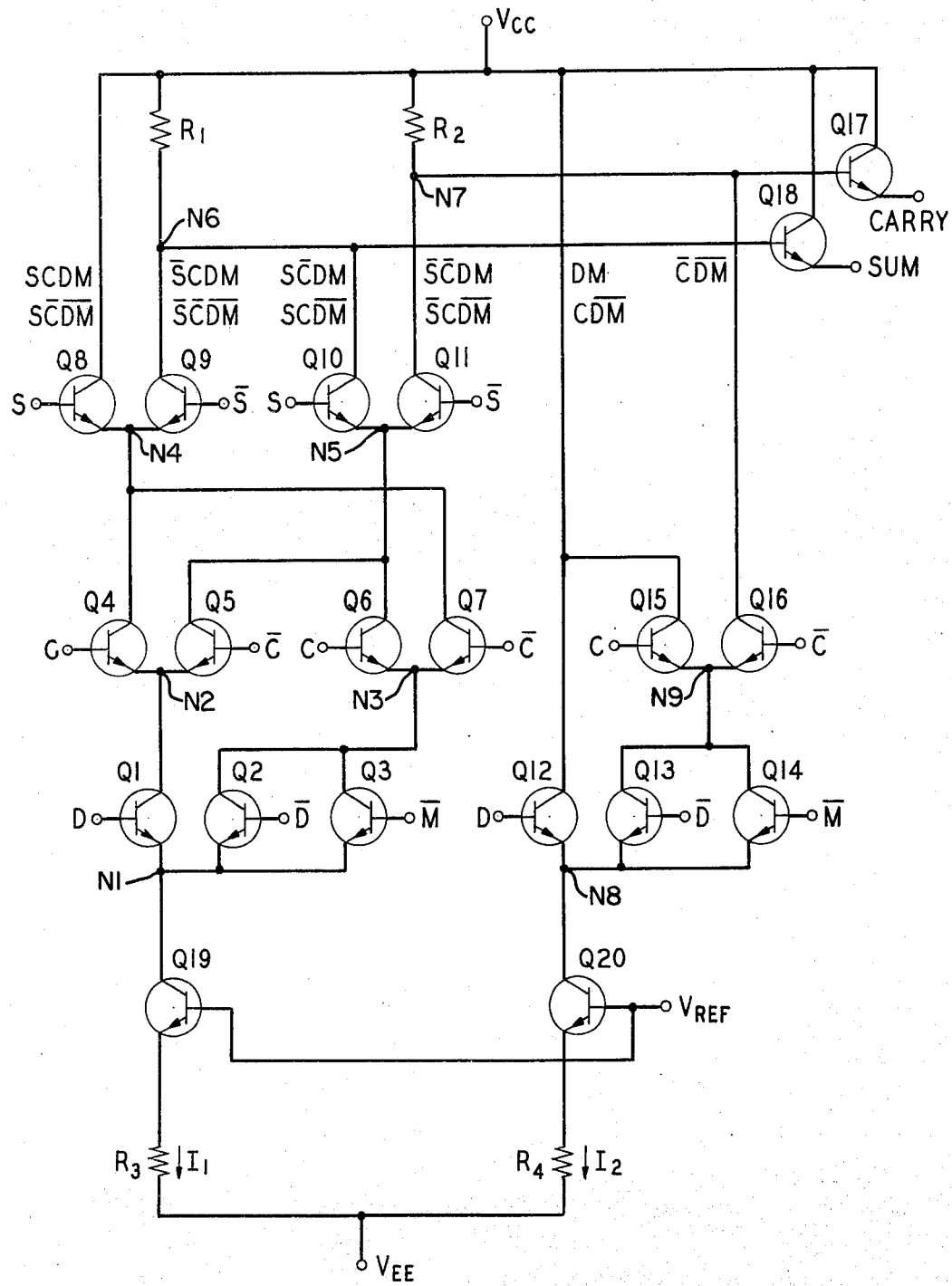
FIG. 1 shows a circuit implementation of a typical embodiment of the present invention.

FIG. 1 illustrates a 1-bit current-mode adder circuit in accordance with a preferred embodiment of the present invention. The elementary inputs to the adder of the circuit of FIG. 1 are the summand bits S and D, the carry input C, and their respective complement signals $\overline{S}$, $\overline{D}$, and $\overline{C}$. Since the circuit of FIG. 1 is intended to be readily incorporated in a serial multiplier context, another variable $\overline{M}$ is also conveniently provided, as will be discussed below. The variable M, while appearing frequently in the discussion to follow, is not explicitly required as a circuit input.

When the circuit of FIG. 1 is to be used for a serial addition, the $\overline{M}$ input is set at logical 0, the CARRY output of the previous addition cycle of the adder is fed back to the C input, and the S and D inputs are the summand bits. When a string of adders is used in a serial multiplier, the SUM output of the preceding adder in the string is applied to the S input, the CARRY output of the previous addition cycle of the adder is fed back to the C input, and the D and $\overline{M}$ inputs, which are ANDed together, are the multiplicand and the complement of the multiplier bit, respectively.

The 1-bit adder circuit of FIG. 1 consists of two series-gating trees; one is formed by the two current switches $Q_{12}$–$Q_{14}$ and $Q_{15}$–$Q_{16}$, which have input nodes N8 and N9, respectively. The second is formed by the five current switches realized by transistors $Q_1$ through $Q_{11}$ having input nodes N1 through N5. The source current $I_1$, defined by $Q_{19}$ and $R_3$, flows through one of the four transistors $Q_8$ through $Q_{11}$ depending on the state of the input variables S, C, D and M. For example, if D and M are high ($\overline{D}$ and $\overline{M}$ are low), $I_1$ will flow through $Q_1$ in the current switch $Q_1$–$Q_3$. In like manner, $I_1$ will flow through $Q_4$ and $Q_8$ when C is high and S is high. Therefore, the logic expression SCDM is used to denote an input condition for $I_1$ to flow through $Q_8$. The input conditions for which $I_1$ flows in $Q_8$ through $Q_{11}$ are shown in FIG. 1 adjacent the respective collectors. The current $I_2$, established by $Q_{20}$ and $R_4$, is directed through the series-gating tree consisting of $Q_{12}$ through $Q_{16}$ in the same manner as $I_1$ is directed through the other series-gating tree.

The two current switches formed by $Q_1$–$Q_3$ and $Q_{12}$–$Q_{14}$ realize the AND of D and M. In order to form this AND function, the high voltage level of $\overline{M}$ must be sufficiently larger than the high voltage level of D so that $I_1$ flows in $Q_3$ and the low voltage level of $\overline{M}$ must be sufficiently lower than the low voltage level of D so that $I_1$ flows in either $Q_1$ or $Q_2$, depending on the value of D. Consequently, the voltage swing of M is necessarily larger than that of D. This is not a serious disadvantage in the serial arithmetic use of the adder, however. If the adder is used as a serial adder, the M input is held low at $V_{EE}$. If the adder is used in a serial multiplier, the D input is used for the multiplicand bit input and the M input is the complement of the multiplier input. The multiplicand bits are advantageously stored in a flip-flop on the same integrated circuit chip as the adder, and as a result, the signal swing is kept to a third of the conventional signal swing. The multiplier input, on the other hand, is an offchip signal. Assuming other circuitry is of standard emitter coupled logic (ECL) design, the multiplier inputs appear with the normal ECL voltage swings.

From the logic expressions in FIG. 1 associated with each collector of the transistors $Q_8$ through $Q_{11}$, it is seen that the current $I_1$ will flow in $R_1$ if $$\overline{S}\overline{C}DM \lor S\overline{C}DM \lor SC\overline{DM} \lor \overline{SCDM} = 1, \qquad (1)$$

where $\lor$ indicates a logical OR. Note that when $I_1$ flows in $R_1$, the voltage at node N6 and thus at the base of $Q_{18}$ is low and the SUM output is low or, equivalently, the SUM output is logical 0. Therefore, from Equation (1) the SUM output is expressed as $$\overline{\text{SUM}} = \overline{S}\overline{C}DM \lor S\overline{C}DM \lor SC\overline{DM} \lor \overline{SCDM} \qquad (2)$$
$$= SCDM \lor S\overline{CDM} \lor \overline{S}CDM \lor \overline{S}CDM$$

In an analogous manner, the CARRY output generated in response to current at node N7, is expressed as $$\text{CARRY} = SC \lor SDM \lor CDM. \qquad (3)$$

The series-gating circuit of FIG. 1 requires that the three inputs S, C, and D all be at different voltage levels. In serial arithmetic adder outputs typically drive flip-flops that in turn drive adder inputs. Consequently, level shifting is typically required. For purpose of the circuit of FIG. 1, the magnitude of the level shift is adjusted to provide the proper signal interface between the adder and the associated flip-flops.

The circuit of FIG. 1 can be fabricated using standard integrated circuit processing, e.g., the standard buried layer process described in R. M. Warner (ed), Integrated Circuits Design Principles and Fabrication, McGraw Hill 1965. When fabricated with standard junction isolated processing, the adder shown in FIG. 1 requires approximately 800 mils² of area with $12\mu$ metal line width and spacing, and $18\mu$ square minimum emitter size.

Typical operating values for the circuit of FIG. 1 are
$R_1 = 2400\ \Omega$
$R_2 = 2400\ \Omega$
$R_3 = 1000\ \Omega$
$R_4 = 1000\ \Omega$
$V_{CC} = 0.0\ V$
$V_{EE} = -5.2\ V$
$V_{REF} = -4.2\ V$
$S, \overline{S};\ 0 = -1.45V,\ 1 = -1.15V$
$D, \overline{D};\ 0 = -3.45V,\ 1 = -3.15V$
$C, \overline{C};\ 0 = -2.45V,\ 1 = -2.15V$
$\overline{M};\ 0 = -3.75V,\ 1 = -2.85V$ The system parameters give rise to a circuit power dissipation of 5.8 mW.

CIRCUIT PERFORMANCE

The dynamic response of the 1-bit adder circuit of FIG. 1 may be considered for designs with several different power dissipations. Values for parasitic capacitances commensurate with presently available, standard, junction isolated integrated circuit processing give rise to typical dynamic resonse curves shown in FIG. 2 under 5.8 mW power dissipation conditions. The voltage levels are shown relative to the mid-point of their 1 and 0 logic levels. The nominal 300 mV signal swings were chosen for S, C and D are conveniently provided by storage cells located on the same chip as the adder. Such an arrangement provides on margins and lower resulting noise. The 900 mV swing chosen for M is compatible with conventional current-mode logic. The SUM and CARRY voltage swings are set at about 700 mV since they typically drive storage cells having a reference set midway in the signal swing.

Figure 2:
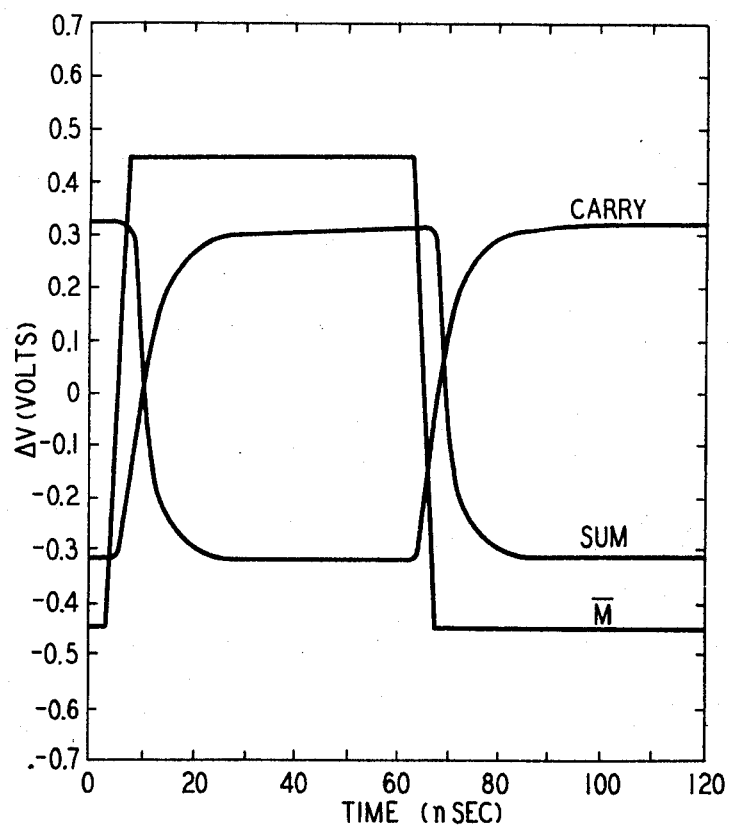
FIG. 2 shows typical dynamic response curves for the circuit of FIG. 1.

FIG. 2 shows the dynamic response for a power dissipation of 5.8 mW with the following input conditions:

| | | |
|---|---|---|
| C | logical 0 | |
| S and D | logical 1 | (4) |
| M | pulsed 0-1-0. | |

From FIG. 2 the propagation delay is seen to be less than 5.3 nsec and the 20–80 percent rise/fall times are less than 6.8 nsec. With the power dissipation at 5.8 mW, the resulting power-delay product is 30.5 pJ.

Figure 3:
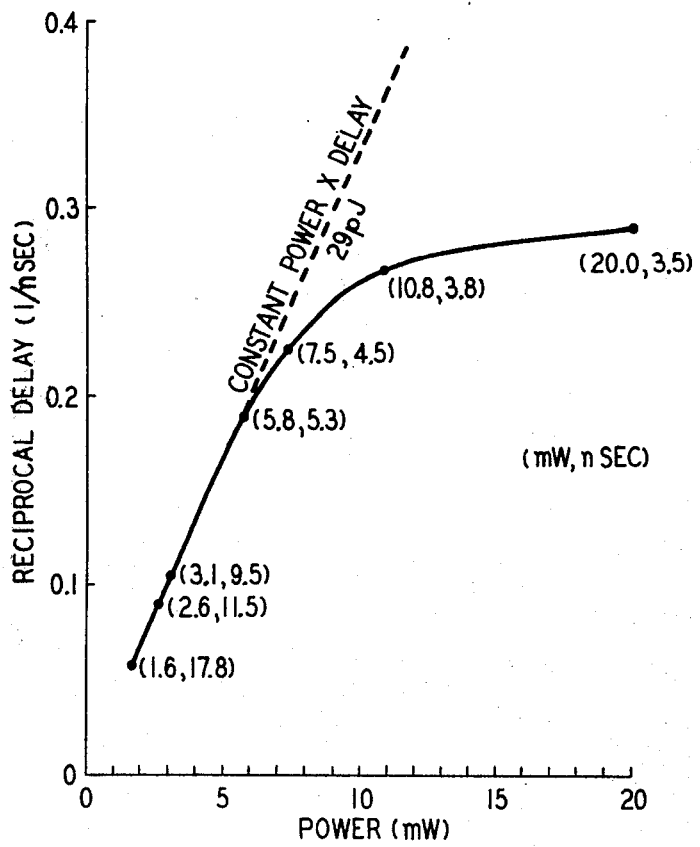
FIG. 3 shows typical power-delay products for different particular operating conditions.

FIG. 3 shows the power dissipation plotted as a function of the reciprocal of the propagation delay for the circuit of FIG. 1. In this graph, the loci of constant power-delay products are straight lines through the origin. From FIG. 3, the adder circuit of FIG. 1 is seen to maintain a constant power-delay product of 29 pJ for medium and low speeds (propagation delays greater than 5.3 nsec). At propagation delays of less than 5.3 nsec the power-delay product increases.

From the foregoing, it can be seen that if the adder of FIG. 1 is to interface only with intrachip signals, a power-delay product of approximately 30 pJ may be achieved. This is a factor of four below the power-delay product for the basic circuit (neglecting level shifting networks) in a conventional ECL full adder, such as the MC1019 described in MECL Integrated Circuits Handbook, First Edition, Motorola Semiconductor Products, Inc., 1971. It is an order of magnitude better than performance obtainable using available custom metallized TTL gate arrays.

Although the above detailed description has proceeded largely in terms of a generalized circuit applicable to serial addition by itself or as a component function in a serial multiplication process, it should be clear that simplifications may be effected which, though limiting its function only to the serial addition function, nevertheless simplify the circuitry appearing in FIG. 1.

In particular, transistors $Q_3$ and $Q_{14}$ may, when such simplification is desired, be eliminated. Likewise, the need for the application of the $\overline{M}$ may be eliminated.

Although it has been assumed that the $\overline{M}$ signal is routinely applied from an external source, a simple stored device capable of assuming either of two values may be provided under user control in the form of a flip-flop or the like.

What is claimed is:

1. Apparatus performing sum and carry output signals in response to applied first and second summand input signals, a carry input signal and complements of said input signals comprising
   first and second current sources for generating substantially constant currents $I_1$ and $I_2$, respectively,
   first and second tree arrays each having a base node, a plurality of terminal nodes, and a hierarchy of levels of interconnected switches, the lowest level being adjacent said base node, each path connecting said base node to a terminal node including a plurality of switches, each of said plurality of switches being responsive to a unique combination of said summand and carry input signals,
   means connecting said first current source to the base node of said first tree array,
   means connecting said second current source to the base node of said second tree array, and
   output means for generating said sum and carry output signals in response to the selection of paths between said base nodes in said first and second tree arrays and respective terminal nodes in said first and second tree arrays in response to a particular pattern of said input signals, at least a first pair of said paths including different ones of said switches in one level and sharing a common switch in a higher level.

2. Apparatus according to claim 1 wherein said output means comprises first and second resistors, means for connecting said first and second resistors between said terminal nodes of said first and second tree arrays and a reference voltage, and first and second amplifiers responsive to voltages appearing across said first and second resistors, respectively, to generate said sum and carry output signals.

3. Apparatus according to claim 1 wherein one level in each of said tree arrays comprises switches responsive only to said carry input signal and its complement.

4. Apparatus according to claim 3 wherein one level in said first tree array comprises switches responsive only to said first summand signal and its complement.

5. Apparatus according to claim 4 wherein one level in each of said tree arrays comprises switches responsive only to said second summand input signal.

6. Apparatus performing sum and carry output signals in response to applied first and second summand input signals, a carry input signal and complements of said input signals comprising
   first and second current sources for generating substantially constant currents $I_1$ and $I_2$, respectively,
   first and second tree arrays each comprising a plurality of levels of interconnected switches, each having a base node and a plurality of terminal nodes, each path connecting said base node to a terminal node including a plurality of switches, each of said plurality of switches being responsive to a unique combination of said summand and carry input signals, one level in each of said tree arrays comprising switches responsive only to said carry input signal and its complement, and one level in said first tree array comprising switches responsive only to said first summand signal and its complement,
   means connecting said first current source to the base node of said first tree array,
   means connecting said second current source to the base node of said second tree array,
   first and second output means for generating said sum and carry output signals in response to the selection of paths between said base nodes in said first and second tree arrays and respective terminal nodes in said first and second tree arrays in response to a particular pattern of said input signals, and
   means for generating a multiply input signal indicating that the sum and carry signals to be formed are to be used in further forming a product signal, and wherein one level in each of said tree arrays comprises switches responsive to signals representing logical AND of said multiply signal and said summand signal, or signals representing the complement of said logical AND.

7. In an adder, sum circuitry for generating a sum output bit in response to first, second and third input bits each having a first or a second value, said sum circuitry comprising,
   first through sixth nodes,
   means for applying a first substantially constant current to said first node,
   means for switching said first current from said first node to said second node when said first input signal has said first value and to said third node when it has said second value,
   means for switching current at said second node to said fourth node when said second signal has said first value and to said fifth node when it has said second value,
   means for switching current at said third node to said fifth node when said second signal has said first value and to said fourth node when it has said second value,
   means for switching current at said fourth node to said sixth node when said third signal has said second value,
   means for switching current at said fifth node to said sixth node when said third signal has said first value, and
   first output means normally providing said sum output bit at one value and operative when said first substantially constant current is switched to said sixth node for providing said sum output bit at another value.

8. The adder of claim 7 further comprising carry circuitry for generating a carry output bit in response to said input bits, said carry circuitry comprising
   seventh through ninth nodes,
   means for switching current at said fifth node to said seventh node when said third bit has said second value,
   means for applying a second substantially constant current to said eighth node,
   means for switching said second current from said eighth node to said ninth node when said first bit has said second value,
   means for switching current at said ninth node to said seventh node when said second signal has said second value, and second output means normally providing said carry output bit at one value and operative when either of said first or second substantially constant currents is switched to said seventh node for providing said carry output bit at another value.

9. The adder of claim 8 wherein said first output means comprises a first resistor, means for connecting said first resistor between a voltage source and said sixth node and means for generating said sum output bit in response to voltages across said first resistor and wherein said second output means comprises a second resistor, means for connecting said second resistor between said voltage source and said seventh node and means for generating said carry output bit in response to voltages across said second resistor.

* * * * *